United States Patent
Havens et al.

(10) Patent No.: US 6,972,567 B2
(45) Date of Patent: Dec. 6, 2005

(54) GRADIENT COIL AND METHOD FOR CONSTRUCTION

(75) Inventors: Timothy John Havens, Florence, SC (US); Michael Sellers, Florence, SC (US); Delton Grey, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/707,827

(22) Filed: Jan. 15, 2004

(65) Prior Publication Data

US 2005/0156596 A1    Jul. 21, 2005

(51) Int. Cl.$^7$ .............................................. G01V 3/00
(52) U.S. Cl. ...................................... 324/319; 324/318
(58) Field of Search .............................. 324/319, 318, 324/309, 307, 322, 300; 128/653; 325/219

(56) References Cited

U.S. PATENT DOCUMENTS

| | | | |
|---|---|---|---|
| 4,733,189 A | 3/1988 | Punchard et al. ........... 324/318 |
| 4,840,700 A | 6/1989 | Edelstein et al. ........... 156/634 |
| 5,126,672 A * | 6/1992 | Le Roux .................... 324/309 |
| 5,378,989 A | 1/1995 | Barber et al. ............... 324/318 |
| 5,442,290 A * | 8/1995 | Crooks ....................... 324/309 |
| 5,886,548 A | 3/1999 | Doty et al. ................. 324/318 |
| 5,990,680 A * | 11/1999 | Mansfield ................... 324/318 |
| 6,042,711 A | 3/2000 | Sadey et al. ................ 205/111 |
| 6,160,399 A * | 12/2000 | Radziun et al. ............. 324/319 |
| 6,433,549 B1 * | 8/2002 | Dean et al. ................. 324/319 |
| 6,500,349 B2 | 12/2002 | Andresakis et al. .......... 216/13 |
| 6,569,543 B2 | 5/2003 | Brenneman et al. ........ 428/607 |
| 6,616,976 B2 | 9/2003 | Montano et al. ............ 427/327 |
| 2003/0050527 A1 * | 3/2003 | Fox et al. ..................... 600/13 |

OTHER PUBLICATIONS

Alphaprep—Bonding promoter for Innerlayers; 13 pages; alphapcFAB Division; GalvaNord.
Magnabond CO-300 Copper Oxide Process; 5 pages; chemelex Product Data Sheet; Product # K3101 & K3100.

* cited by examiner

*Primary Examiner*—Brij B. Shrivastav
(74) *Attorney, Agent, or Firm*—Cantor Colburn LLP

(57) ABSTRACT

The disclosed apparatus relates to a gradient coil assembly for a magnetic resonance imaging system. The gradient coil assembly comprises: at least two coils. The coils comprise: at least one conductor mechanically bonded via a nonconducting substrate. The bonding surface of the at least one conductor has been subjected to a surface treatment to improve the mechanical bonding properties of the bonding surface. The disclosed apparatus also relates to a magnetic imaging system. The magnetic imaging system comprises: a system controller; a gradient amplifier unit in operable communication with the system controller; a magnetic assembly in operable communication with the gradient amplifier. The magnetic assembly comprises: a gradient coil assembly comprising at least two coils. The coils comprise: at least one conductor mechanically bonded via a nonconducting substrate. A bonding surface of the at least one conductor has been subjected to a surface treatment to improve the mechanical bonding properties of the bonding surface. The disclosed method relates to assembling a gradient coil assembly. The method comprises: treating a bonding surface of at least one conductor; and bonding the at least one conductor to a nonconducting substrate.

21 Claims, 3 Drawing Sheets

GRADIENT COIL AND METHOD FOR CONSTRUCTION

TECHNICAL FIELD

The current disclosed method and apparatus relate to a magnetic resonance imaging ("MRI") system. More specifically, the disclosed method and apparatus relate to a gradient coil used in an MRI system.

BACKGROUND OF THE INVENTION

MRI systems use gradient coils to generate magnetic field gradients along desired axes. Copper conductors in the gradient coils are usually held in place in the gradient coils by a mechanical bonding, often some type of nonconductive epoxy resin. Adjacent gradient coils are generally separated a predetermined distance. A gap formed between adjacent gradient coils may be filled with a nonconductive epoxy resin.

The gradient coil carries current in the copper conductors, and must operate in a background field of an MRI magnet. The demands on the performance of the gradient coil have increased due to higher currents, higher background fields, and the need for lower acoustic noise. In particular, the peak operating current has increased by a factor of two while the background field has also increased by more than a factor of 2 over the last few years. Thus, electromagnetic forces have increased by more than a factor of 4. This increased force load is placing ever higher demands on the structural integrity of the gradient coil.

When in operation, repulsive forces act on the gradient coils and the copper conductors in the gradient coils. Because electromagnetic forces have increased by a factor of 4, and may continue to increase in the future, it is desirable to build gradient coils that will withstand these electromagnetic forces and increased forced loads acting on them and still maintain optimal acoustic performance.

BRIEF DESCRIPTION OF THE INVENTION

The disclosed apparatus relates to a gradient coil assembly for a magnetic resonance imaging system. The gradient coil assembly comprises: at least two coils. The coils comprise: at least one conductor mechanically bonded via a nonconducting substrate. The bonding surface of the at least one conductor has been subjected to a surface treatment to improve the mechanical bonding properties of the bonding surface.

The disclosed apparatus also relates to a magnetic imaging system. The magnetic imaging system comprises: a system controller; a gradient amplifier unit in operable communication with the system controller; a magnetic assembly in operable communication with the gradient amplifier. The magnetic assembly comprises: a gradient coil assembly comprising at least two coils. The coils comprise: at least one conductor mechanically via a nonconducting substrate. A bonding surface of the at least one conductor has been subjected to a surface treatment to improve the mechanical bonding properties of the bonding surface.

The disclosed method relates to assembling a gradient coil assembly. The method comprises: treating a bonding surface of at least one conductor; and bonding the at least one conductor to a nonconducting substrate.

BRIEF DESCRIPTION OF THE DRAWINGS

Referring now to the figures, which are exemplary embodiments, and wherein like elements are numbered alike.

DETAILED DESCRIPTION OF THE INVENTION

Figure 1:
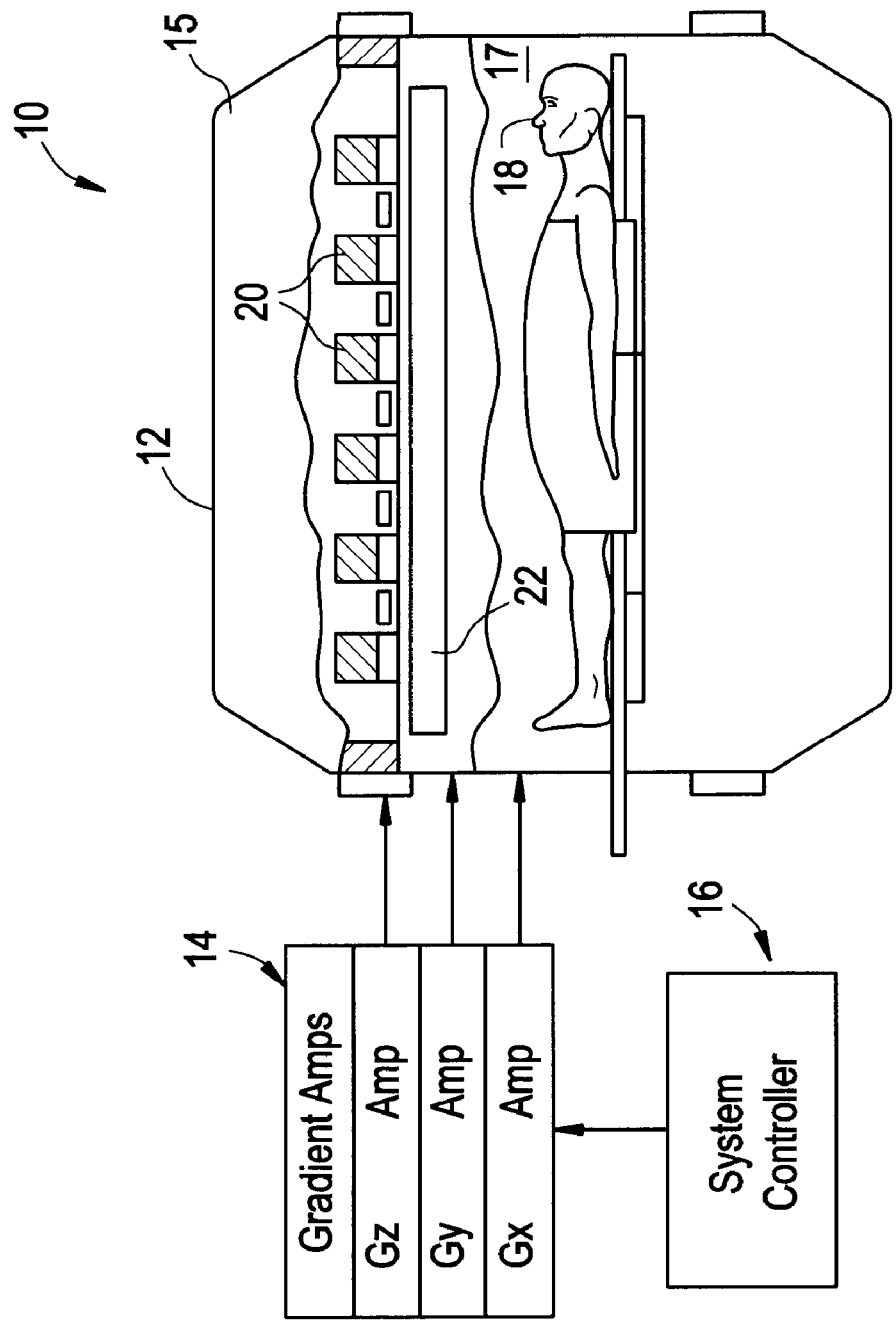
FIG. 1 depicts a schematic view of a disclosed MRI system.
Figure 2:
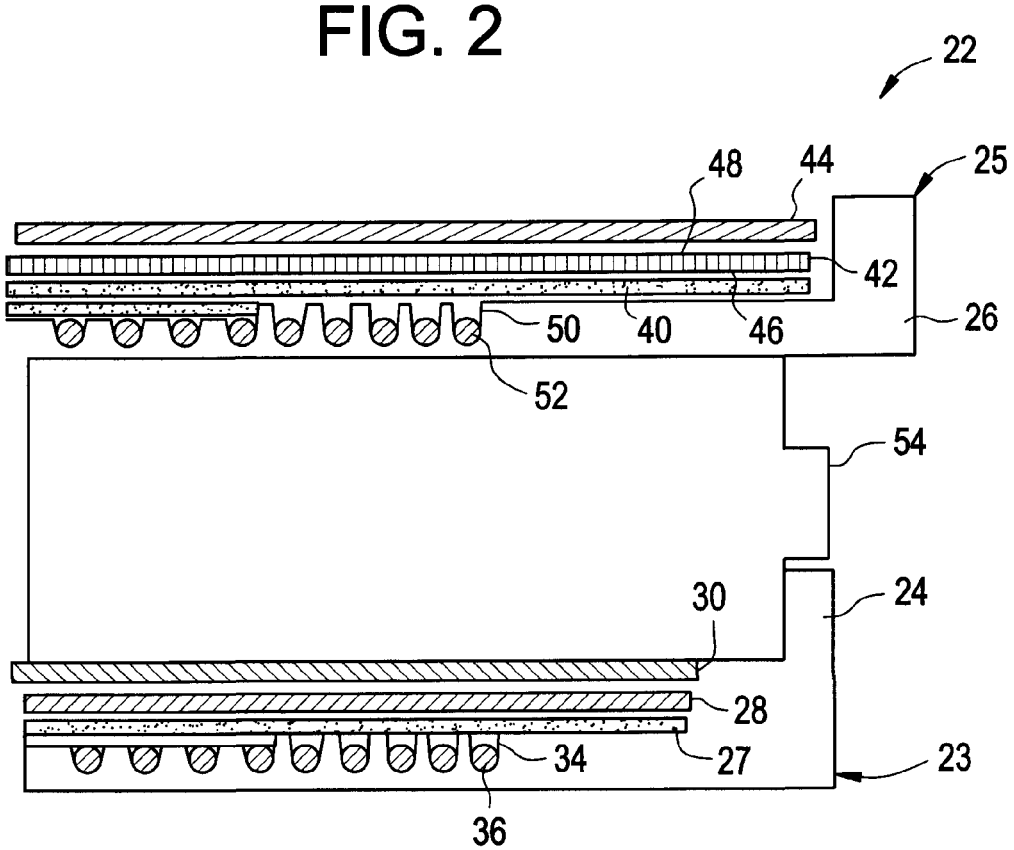
FIG. 2 depicts a schematic view of a disclosed gradient coil.
Figure 2:
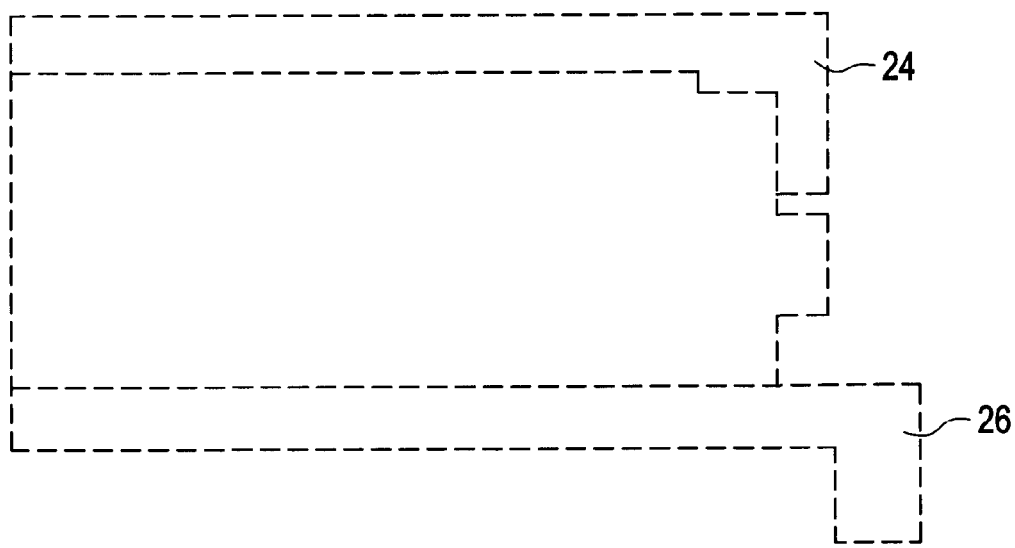
Figure 3:
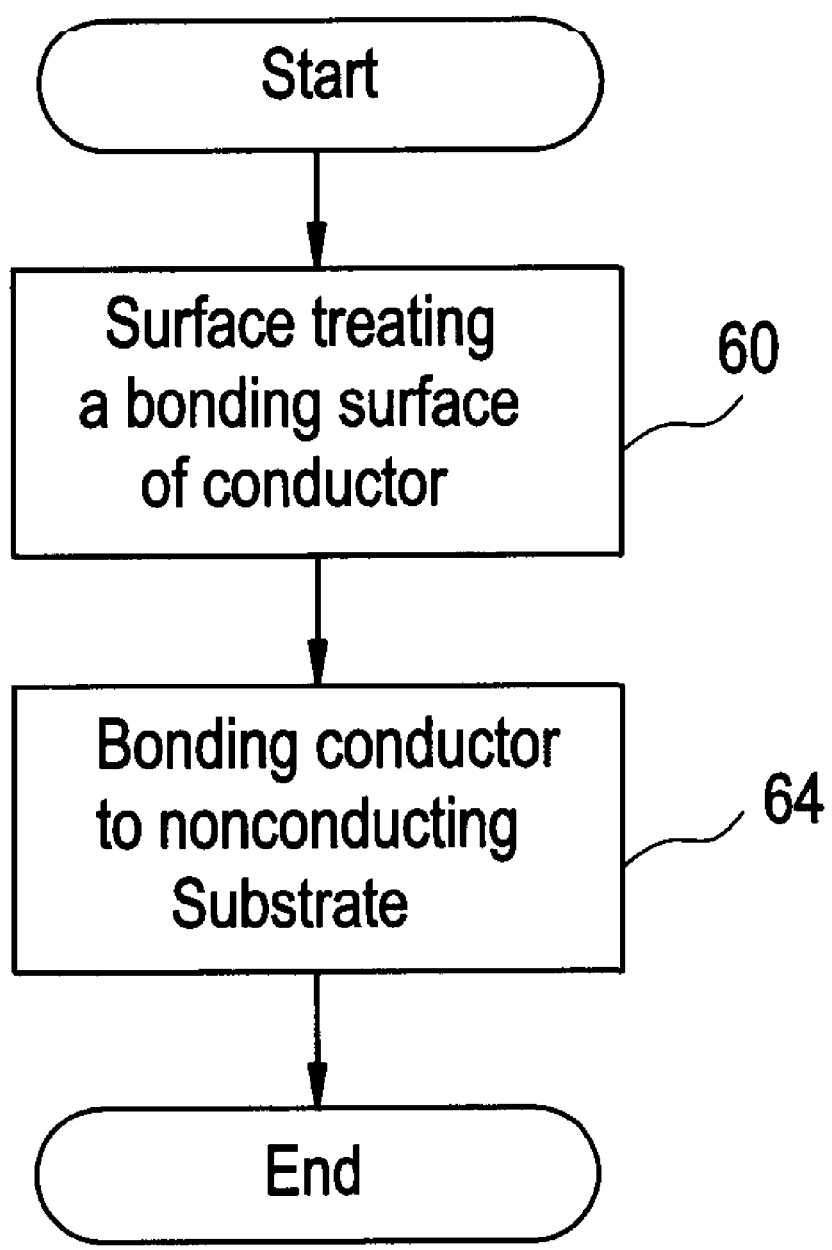
FIG. 3 depicts a flowchart illustrating a disclosed method for constructing a gradient coil.

A detailed description of several embodiments of the disclosed apparatus and method are presented herein by way of exemplification and not limitation with reference to FIGS. 1 through 3. Identical reference numerals represent identical components in the various views.

Referring to FIG. 1, an exemplary MRI system 10 is provided for generating images of a person 18. MRI system 10 may comprise a magnetic assembly 12, a gradient amplifier unit 14, and a system controller 16.

Magnetic assembly 12 is provided to generate magnetic fields that will be propagated to person 18. Assembly 12 may comprise a housing 15 defining a chamber 17 for receiving person 18. Assembly 12 may further comprise polarizing magnets 20, and a gradient coil assembly 22 having a plurality of coils. Gradient coil assembly 22 generate magnetic fields along a predetermined axes in response to signals received from the gradient amplifier unit 14.

Referring to FIG. 2, an exemplary gradient coil assembly 22 includes an inner gradient coil assembly 23, an outer gradient coil assembly 25, and an epoxy layer 54 disposed between assemblies 23,25.

Inner gradient coil assembly 23 includes an inner gradient tube 24, an inner (Z) coil 27, an inner (Y) coil 28 and an inner (X) coil 30.

Inner gradient tube 24 is provided to be disposed within an outer gradient tube 26 and is disposed about an axis 33. Gradient tube 24 may be constructed from a fiber composite material comprising one or more layers wherein each layer comprises a plurality of fibers such as glass fibers, carbon fibers, Kevlar fibers, and aluminum oxide particles, coated with the epoxy resin.

Inner (Z) coil 27 is provided to generate a magnetic field gradient along a predetermined Z-axis (not shown). Coil 27 may be disposed proximate gradient tube 24. In particular, coil 27 may be disposed on an outer surface of tube 24. Coil 27 may include a plurality of copper conductors 36 disposed in a plurality of grooves 34 formed in tube 24. The copper conductors 36 may be mechanically bonded to the grooves 34 by a nonconducting resin epoxy.

Inner (Y) coil 28 is provided to generate a magnetic field gradient along a predetermined Y-axis (not shown). Coil 28 may comprise a plurality conductors a (not shown) mechanically bonded to the inner gradient tube 24 by a nonconducting epoxy resin layer (not shown). These conductors may be saddle coils.

Inner (X) coil 30 is provided to generate a magnetic field gradient along a predetermined X-axis (not shown). Coil 30 may comprise a plurality of conductors (not shown) mechanically bonded to the inner gradient tube 24 by a nonconducting epoxy resin layer (not shown). These conductors may be saddle coils.

Outer gradient coil assembly 25 includes an outer gradient tube 26, an outer (Z) coil 40, an outer (Y) coil 42, and an outer (X) coil 44.

Outer gradient tube 26 is disposed around an inner gradient tube 24 and is disposed about axis 33. Gradient tube 26 may be constructed from a fiber composite material comprising one or more layers wherein each layer comprises a plurality of fibers such as glass fibers, carbon fibers, Kevlar fibers, and aluminum oxide fibers, coated the epoxy resin.

Outer (Z) coil 40 is provided to generate a magnetic field gradient along the Z-axis that is disposed to provide electromagnetic shielding of the inner (Z) coil 27 such that any magnetic flux straying outside of gradient coil assembly 22 is minimized. Coil 40 may be disposed proximate gradient tube 26. In particular, coil 40 may be disposed on an outer surface of tube 26. Coil 40 may include a plurality of copper conductors 52 disposed in a plurality of grooves 50 formed in tube 26.

Outer (Y) coil 42 is provided to generate a magnetic field gradient along the Y-axis that is disposed to provide electromagnetic shielding of the inner (Y) coil 28 such that any magnetic flux straying outside of gradient coil assembly 22 is minimized. Coil 42 may comprise a plurality a conductors coils (not shown) mechanically bonded to the outer gradient tube 26 by a nonconducting epoxy resin layer (not shown). These conductors may be saddle coils.

Outer (X) coil 44 is provided to generate a magnetic field gradient along the X-axis that is disposed to provide electromagnetic shielding of the inner (X) coil 30 such that any magnetic flux straying outside of gradient coil assembly 22 is minimized. Coil 44 may comprise a plurality of conductors (not shown) mechanically bonded to the outer gradient tube 26 by a nonconducting epoxy resin layer (not shown). These conductors may be saddle coils.

Epoxy layer 54 may be disposed between inner gradient coil assembly 23 and outer gradient coil assembly 25 to maintain a predetermined distance between assemblies 23, 25. Epoxy layer 54 may be formed from an epoxy resin or a polyester resin. Epoxy layer 54 is preferably substantially non-conductive.

The copper conductors 28, 30, 36, 42, 44, 52 associated with the inner and outer (Z), (Y) and (X) coils, which may be solenoidal or saddle coils, may all be mechanically bonded via a nonconducting epoxy resin layer. However, in current MRI systems, since the electromagnetic forces have increased by about a factor of 4, and may continue to increase in the future. These electromagnetic forces act as repulsive forces act on the gradient coils and the copper conductors in the gradient coils, thus it is desired to improve the bonding between coils and the epoxy resin.

Dendritic Structure Treatment

Conductible materials such as copper have become widely used in a wide variety of electronic and electrical component technologies. Commercially, the primary means by which desirable properties are added to such materials is by electro deposition of metals from metallic ion-containing baths. Such processes have been used to produce a matte surface having microscopic dendritic (i.e., tree-like or nodular) structures to aid in adhering the bonding surface to other materials, such as a nonconductive epoxy resin. Electro deposition has also been used to apply certain metals as a thermal barrier, an elevated temperature metal diffusion barrier, an oxidation barrier, a chemical corrosion barrier, and/or provide certain electrical properties such as electric current resistance.

After the conductible material has been treated to achieve the aforementioned properties, it is particularly well suited for use in various electronic and electrical components. The technologies for the production of conductible materials by electro deposition from electroplating baths and/or processing the metal in a roll mill are well known in the PCB art, but as of yet have not been used for improving the mechanical bond between the copper conductors and epoxy resin in gradient coils.

A disclosed example of production of a conductive material for use as a conductor to be mechanically bonded to a nonconductive epoxy resin in a gradient coil is the production of the conductive material by electro deposition processes. Such processes generally involve the use of an electroforming cell (EFC) consisting of an anode and a cathode, an electrolyte bath solution, generally containing copper sulfate and sulfuric acid, and a source of current at a suitable potential. When voltage is applied between the anode and cathode, copper deposits on the cathode surface.

The conductive material, in this case copper, treatment process begins by forming the electrolyte solution, generally by dissolving (or digesting) a metallic copper feed stock in sulfuric acid. After the copper is dissolved the solution is subjected to an intensive purification process to ensure that the electro deposited copper contains no disruptions and/or discontinuities. Various agents for controlling the properties may be added to the solution.

The solution is pumped into the EFC and when voltage is applied between the anode and cathode, electro deposition of copper occurs at the cathode. Typically, the process involves the use of rotatable cylindrical cathodes (drums) that may be of various diameters and widths. The electrodeposited copper is then removed from the cylindrical cathode as a continuous web as the cathode rotates. The anodes typically are configured to conform to the shape of the cathode so that the separation or gap therebetween is constant. This is desirable in order to produce a copper having a consistent thickness across the web. Copper prepared using such conventional electro deposition methodology have a smooth shiny (drum) side and a rough or matte (copper deposit growth front) side.

Conductive materials for gradient coil applications may be conventionally treated, at least on the matte side, for enhanced bonding and peel strength between the matte side and the epoxy resin. Typically treatment involves treatment with a bonding material to increase surface area and thus enhance bonding and increase peel strength. The conductive material may also be treated to provide a thermal barrier, which may be brass, to prevent peel strength from decreasing with temperature. Finally, the conductive material may be treated with a stabilizer to prevent oxidation of the foil. These treatments of creating a matte surface having microscopic dendritic structures may improve the peel strength of the conductive material to about 10 lbs per inch.

Oxide Treatment

Another method of increasing the mechanical bond strength of the conductive material, in this example copper, and the epoxy resin is to form a layer of copper oxide, such as by chemical oxidation of the bonding surfaces. The earliest efforts in this regard (so-called "black oxide" adhesion promoters) produced some improvement in the bonding of the copper to nonconductive epoxy resins, as compared to that obtained without the copper oxide treatment. Subsequent variations on the black oxide technique included methods wherein there is first produced a black oxide coating on the copper surface, followed by post-treatment of the black oxide deposit with about a 15% sulfuric acid to produce a "red oxide" or "brown oxide" to serve as the adhesion promoter. Other methods for improving the mechanical bonding between a conductive material and an epoxy resin include forming oxides from relatively high chlorite/relatively low caustic copper oxidizing compositions. Forming these oxide layers may improve the peel strength to about 4 to 6 lbs per inch.

The disclosed embodiments have the advantage of providing an improved surface on the conducting materials for bonding to a nonconductive epoxy resin. This will enhance the mechanical bond between the conducting materials and the epoxy resin, thereby providing for longer lifespans for the gradient coils and for optimal acoustic performance of the MRI system.

While the embodiments of the disclosed method and apparatus have been described with reference to exemplary embodiments, it will be understood by those skilled in the art that various changes may be made and equivalents may be substituted for elements thereof without departing from the scope of the embodiments of the disclosed method and apparatus. In addition, many modifications may be made to adapt a particular situation or material to the teachings of the embodiments of the disclosed method and apparatus without departing from the essential scope thereof. Therefore, it is intended that the embodiments of the disclosed method and apparatus not be limited to the particular embodiments disclosed as the best mode contemplated for carrying out the embodiments of the disclosed method and apparatus, but that the embodiments of the disclosed method and apparatus will include all embodiments falling within the scope of the appended claims.

What is claimed is:

1. A gradient coil assembly for a magnetic resonance imaging system suitable for generating images of a person comprising:
    at least two gradient coils and a nonconducting tubular substrate for the support thereof, the coils being sized so as to generate a magnetic field suitable for magnetic resonance imaging, the coils comprising:
    at least one conductor having a bonding surface mechanically bonded to the nonconducting tubular substrate;
    wherein the bonding surface has been subjected to a material deposit surface treatment to improve the mechanical bonding properties of the bonding surface to the nonconducting tubular substrate; and
    wherein a bonding resin is disposed between the treated bonding surface and the nonconducting tubular substrate, the combination of the treated bonding surface and the bonding resin in the coil assembly having an improved bond strength as compared to a coil assembly being absent the treated bonding surface.

2. The gradient coil assembly of claim 1, wherein the surface treatment provides a surface of microscopic dendritic structures to the bonding surface of the at least one conductor.

3. The gradient coil assembly of claim 1, wherein the surface treatment provides a black oxide coating on the bonding surface of the at least one conductor.

4. The gradient coil assembly of claim 1, wherein the surface treatment provides a red oxide coating on the bonding surface of the at least one conductor.

5. The gradient coil assembly of claim 1, wherein the surface treatment provides a brown oxide coating on the bonding surface of the at least one conductor.

6. The gradient coil assembly of claim 1, wherein the at least one conductor is a copper conductor.

7. The gradient coil assembly of claim 1, wherein the at least one conductor is a saddle coil.

8. The gradient coil assembly of claim 1, wherein:
    the nonconducting tubular substrate comprises a plurality of grooves; and
    the treated bonding surface of the coil conductor is mechanically bonded to the grooves via a bonding resin such that the combination of the grooves, the treated bonding surface, and the bonding resin in the coil assembly has an improved bond strength as compared to a coil assembly being absent the treated bonding surface.

9. A magnetic imaging system suitable for a images of a person comprising:
    a system controller;
    a gradient amplifier unit in operable communication with the system controller;
    a magnetic assembly in operable communication with the gradient amplifier, the magnetic assembly comprising:
    a gradient coil assembly comprising at least two gradient coils and a nonconducting tubular substrate for the support thereof, the coils being sized so as to generate a magnetic field suitable for magnetic resonance imaging, the coils comprising:
    at least one conductor having a bonding surface mechanically bonded to the nonconducting tubular substrate;
    wherein the bonding surface has been subjected to a material deposit surface treatment to improve the mechanical bonding properties of the bonding surface to the nonconducting tubular substrate; and
    wherein a bonding resin is disposed between the treated bonding surface and the nonconducting tubular substrate, the combination of the treated bonding surface and the bonding resin in the coil assembly having an improved bond strength as compared to a coil assembly being absent the treated bonding surface.

10. The magnetic imaging system of claim 9, wherein the surface treatment provides a surface of microscopic dendritic structures to the bonding surface of the at least one conductor.

11. The magnetic imaging system of claim 9, wherein the surface treatment provides a black oxide coating on the bonding surface of the at least one conductor.

12. The magnetic imaging system of claim 9, wherein the surface treatment provides a red oxide coating on the bonding surface of the at least one conductor.

13. The magnetic imaging system of claim 9, wherein the surface treatment provides a brown oxide coating on the bonding surface of the at least one conductor.

14. The magnetic imaging system of claim 9, wherein the at least one conductor is a copper conductor.

15. The magnetic imaging system of claim 9, wherein the at least one conductor is a saddle coil.

16. The magnetic imaging system of claim 9, wherein the at least one conductor is mechanically bonded to at least one coil.

17. A method for assembling a gradient coil assembly for use in a magnetic resonance imaging system suitable for generating images of a person, the method comprising:
    treating a bonding surface of at least one conductor of a gradient coil with a material deposit surface treatment; and
    bonding the bonding surface of the at least one conductor to a nonconducting tubular substrate using a bonding resin such that the combination of the treated bonding surface and the bonding resin in the coil assembly has an improved bond strength as compared to a coil assembly being absent the treating of the bonding surface.

18. The method for assembling a gradient coil assembly of claim 17, wherein the treating of a bonding surface provides a surface of microscopic dendritic structures to the bonding surface of the at least one conductor.

19. The method for assembling a gradient coil assembly of claim 17, wherein the treating of a bonding surface provides a black oxide coating on the bonding surface of the at least one conductor.

20. The method for assembling a gradient coil assembly of claim 17, wherein the treating of a bonding surface provides a red oxide coating on the bonding surface of the at least one conductor.

21. The method for assembling a gradient coil assembly of claim 17, wherein the treating of a bonding surface provides a brown oxide coating on the bonding surface of the at least one conductor.

* * * * *